US012765426B2

(12) United States Patent
Chiu et al.

(10) Patent No.: US 12,765,426 B2

(45) Date of Patent: Oct. 13, 2026

(54) ENCAPSULATION STRUCTURE

(71) Applicant: PlayNitride Display Co., Ltd., MiaoLi County (TW)

(72) Inventors: Po-Wei Chiu, MiaoLi County (TW); Sheng-Yuan Sun, MiaoLi County (TW); Hoong Lien Lai, MiaoLi County (TW); Loganathan Murugan, MiaoLi County (TW)

(73) Assignee: PlayNitride Display Co., Ltd., MiaoLi County (TW)

(*) Notice: Subject to any disclaimer, the term of this patent is extended or adjusted under 35 U.S.C. 154(b) by 466 days.

(21) Appl. No.: 18/518,619

(22) Filed: Nov. 24, 2023

(65) Prior Publication Data

US 2025/0140758 A1 May 1, 2025

(30) Foreign Application Priority Data

Oct. 27, 2023 (TW) ................................ 112141161

(51) Int. Cl.

*H01L 25/075* (2006.01)
*H01L 33/50* (2010.01)
(Continued)

(52) U.S. Cl.

CPC ............ *H10W 90/00* (2026.01); *H10H 20/84* (2025.01); *H10H 20/8513* (2025.01);
(Continued)

(58) Field of Classification Search

CPC ............. H10K 59/873; H10K 59/8731; H10K 59/8792; H10K 59/122; H10K 59/38;
(Continued)

(56) References Cited

U.S. PATENT DOCUMENTS

2007/0114521 A1* 5/2007 Hayashi ............. H10K 59/8731 257/40
2017/0033268 A1 2/2017 Lee et al.
(Continued)

FOREIGN PATENT DOCUMENTS

TW 202226620 7/2022
TW 202335320 9/2023

OTHER PUBLICATIONS

Taiwan Intellectual Property Office (machine translation), Notice of review opinion, Taiwan Application No. 112141161, Jun. 18, 2024, all pages. (Year: 2024).*
(Continued)

*Primary Examiner* — Victoria K. Hall
(74) *Attorney, Agent, or Firm* — JCIPRNET

(57) ABSTRACT

An encapsulation structure including a substrate, an isolation structure layer, a planarization layer, and a composite layer structure is disclosed. The isolation structure layer is disposed on the substrate and defines multiple sub-pixel areas. The planarization layer is disposed on the substrate, and has a peripheral portion surrounding and covering the isolation structure layer. A thickness of the peripheral portion increases as it approaches the isolation structure layer. The composite layer structure connects the substrate and covers the planarization layer and the isolation structure layer. The composite layer includes two barrier layers and an extension layer. The extension layer is located between and connects the two barrier layers. A thickness, a water vapor transmission rate, and ductility and malleability of the extension layer are respectively greater than a thickness, a water vapor transmission rate, and ductility and malleability of each of the two barrier layers.

12 Claims, 5 Drawing Sheets

(51) Int. Cl.

| | |
|---|---|
| ***H01L 33/54*** | (2010.01) |
| ***H01L 33/58*** | (2010.01) |
| ***H10H 20/80*** | (2025.01) |
| ***H10H 20/84*** | (2025.01) |
| ***H10H 20/851*** | (2025.01) |
| ***H10H 20/853*** | (2025.01) |
| ***H10H 20/854*** | (2025.01) |
| ***H10H 20/855*** | (2025.01) |
| ***H10W 90/00*** | (2026.01) |

(52) U.S. Cl.
CPC .... *H10H 20/8514* (2025.01); *H10H 20/8515* (2025.01); *H10H 20/853* (2025.01); *H10H 20/854* (2025.01); *H10H 20/855* (2025.01); *H10H 20/882* (2025.01)

(58) Field of Classification Search
CPC ............. H10K 59/8722; H10K 50/844; H10K 50/8445; H10K 50/8426; H10H 29/37; H10H 29/852; H10H 29/854; H10H 29/8517; H10H 29/8552
See application file for complete search history.

(56) References Cited

U.S. PATENT DOCUMENTS

| | | | | |
|---|---|---|---|---|
| 2017/0256687 | A1 | 9/2017 | Yoo et al. | |
| 2020/0295310 | A1* | 9/2020 | Moon | H10K 59/38 |
| 2021/0359078 | A1* | 11/2021 | Kim | H10K 59/38 |
| 2021/0376291 | A1* | 12/2021 | Park | H10K 59/88 |
| 2022/0158139 | A1* | 5/2022 | Kim | H10K 59/18 |
| 2022/0352435 | A1* | 11/2022 | Suh | H10H 20/8514 |
| 2023/0138392 | A1* | 5/2023 | Shin | H10K 59/873 257/40 |
| 2023/0240097 | A1* | 7/2023 | Song | H10K 59/122 |
| 2023/0380228 | A1* | 11/2023 | Kim | H10K 59/131 |
| 2024/0099071 | A1* | 3/2024 | Lim | H10K 59/122 |
| 2024/0397789 | A1* | 11/2024 | Park | H10K 59/873 |

OTHER PUBLICATIONS

“Office Action of Taiwan Counterpart Application”, issued on Jun. 18, 2024, p. 1-p. 6.

* cited by examiner

ENCAPSULATION STRUCTURE

CROSS-REFERENCE TO RELATED APPLICATION

This application claims the priority benefit of Taiwan application serial no. 112141161, filed on Oct. 27, 2023. The entirety of the above-mentioned patent application is hereby incorporated by reference herein and made a part of this specification.

BACKGROUND

Technical Field

This disclosure relates to an encapsulation technology, and in particular to an encapsulation structure.

Description of Related Art

In order to meet the demand for color display, a micro light-emitting diode (LED) display panel using color conversion technology has been proposed. Therein, a single wavelength micro light-emitting diode can be combined with different wavelength conversion materials to produce sub-pixels of different display colors.

However, these wavelength conversion materials are prone to failure due to the intrusion of water and oxygen, and need to be coupled with an encapsulation structure to achieve the purpose of blocking water and oxygen. At the same time, since the color conversion technology requires a certain thickness of the wavelength conversion material to meet the conversion efficiency requirements, the barrier wall of the encapsulation structure also needs to have a sufficient height to provide accommodation space. The above limitation makes the film layer of the encapsulation structure prone to defects due to the segmental difference in the heights of the various layers of the structure, which affects the overall water and oxygen blocking effect of the encapsulation structure. In addition, as the conversion efficiency of some wavelength conversion materials is poor, it is necessary to further increase the height of the barrier wall to accommodate more wavelength conversion materials, thus aggravating the problem of water and oxygen intrusion.

SUMMARY

The disclosure provides an encapsulation structure with excellent water and oxygen barrier capability.

The encapsulation structure of the disclosure includes a substrate, an isolation structure layer, a planarization layer, and a composite layer structure. The isolation structure layer is disposed on the substrate and defines multiple sub-pixel areas. The planarization layer is disposed on the substrate and has a peripheral portion surrounding and covering the isolation structure layer. Closer to the isolation structure layer, a thickness of the peripheral portion increases. The composite layer structure connects the substrate and covers the planarization layer and the isolation structure layer. The composite layer structure includes two barrier layers and an extension layer. The extension layer is located between and connects the two barrier layers. A thickness, a water vapor transmission rate, and ductility and malleability of the extension layer are respectively greater than a thickness, a water vapor transmission rate, and ductility and malleability of each of the two barrier layers.

Based on the above, in the encapsulation structure of an embodiment of the disclosure, the planarization layer has the peripheral portion surrounding and covering the isolation structure layer, and closer to the isolation structure layer, the thickness of the peripheral portion increases. Thus, the composite layer structure connecting the substrate is less susceptible to film breakage and encapsulation failure in the area covering the planarization layer and the isolation structure layer. In addition, since the water vapor transmission rate of the barrier layer in the composite layer structure is smaller than the water vapor transmission rate of the extension layer, the barrier layer extending between the extension layer and the planarization layer and connecting the substrate may effectively prevent water vapor from infiltrating into the planarization layer and the isolation structure layer through the extension layer, thus enhancing the overall water and oxygen barrier capability of the composite layer structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate example embodiments of the disclosure and, together with the description, serve to explain the principles of the disclosure.

DESCRIPTION OF THE EMBODIMENTS

Figure 1:
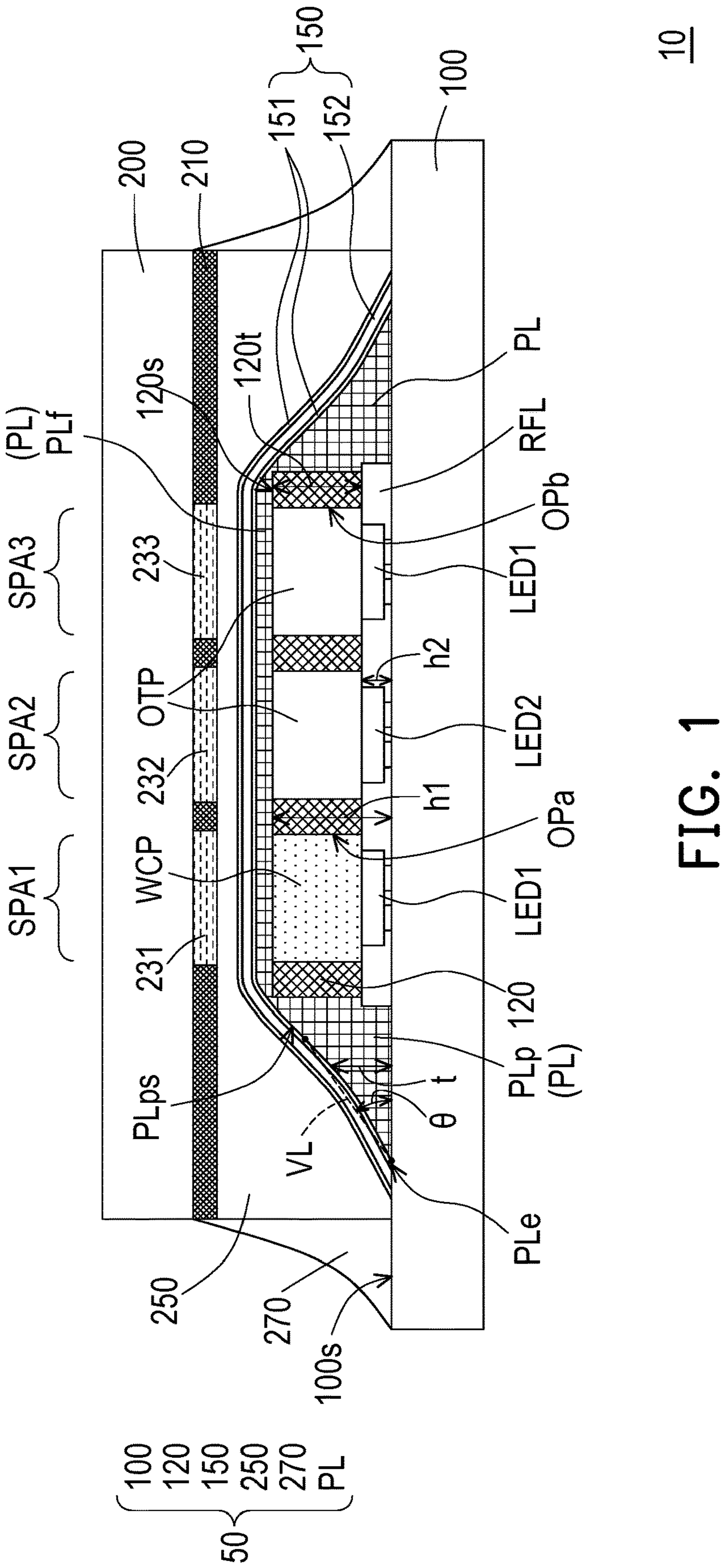
FIG. 1 is a schematic cross-sectional view of a display device using an encapsulation structure according to an embodiment of the disclosure.

In the drawings, the thickness of layers, films, panels, areas, etc., are exaggerated for clarity. It should be understood that when an element such as a layer, film, area, or substrate is referred to as being “on” or “connected to” another element, it can be directly on or connected to the another element, or intermediate elements may also be present. In contrast, when an element is referred to as being “directly on” or “directly connected to” another element, there are no intermediate elements present. As used herein, “connected” may refer to physical and/or electrical connection. Furthermore, “electrical connection” may mean the presence of other elements between the two elements.

Reference will now be made in detail to the exemplary embodiments of the disclosure, examples of which are illustrated in the accompanying drawings. Whenever possible, the same reference numbers are used in the drawings and descriptions to refer to the same or similar parts.

Figure 2B:
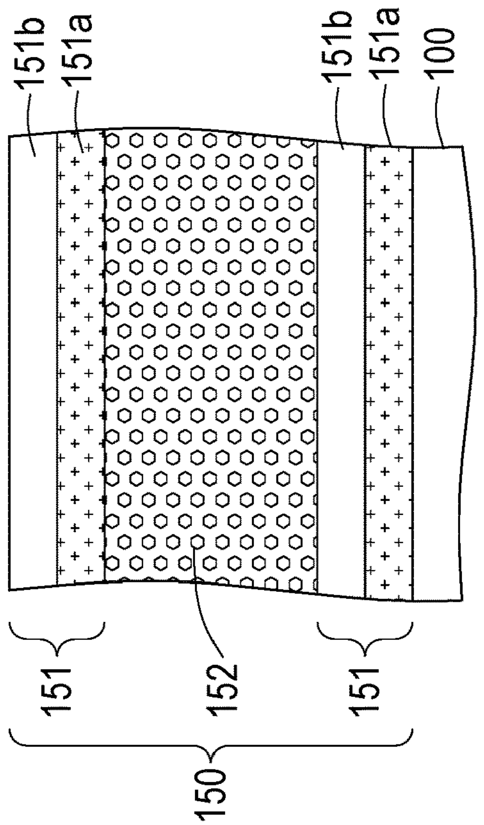
FIG. 2A and FIG. 2B are schematic cross-sectional views of a composite layer structure of FIG. 1.
Figure 2A:
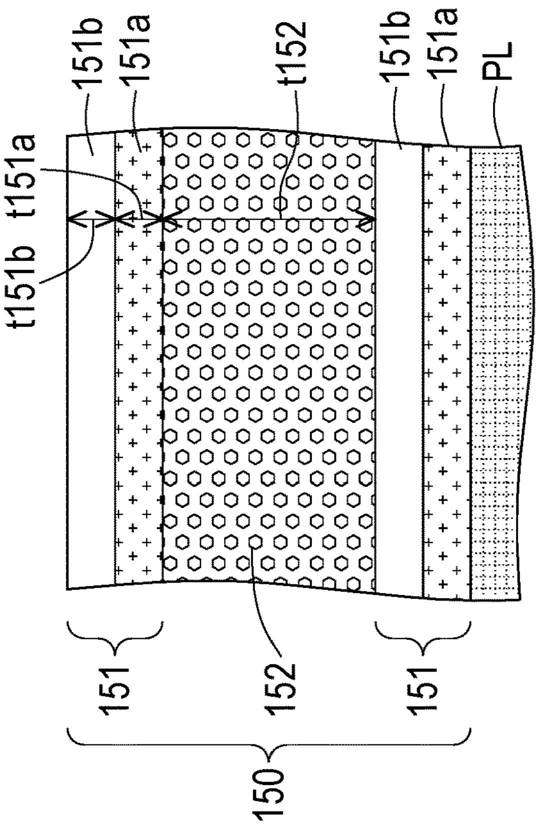
Figure 3:
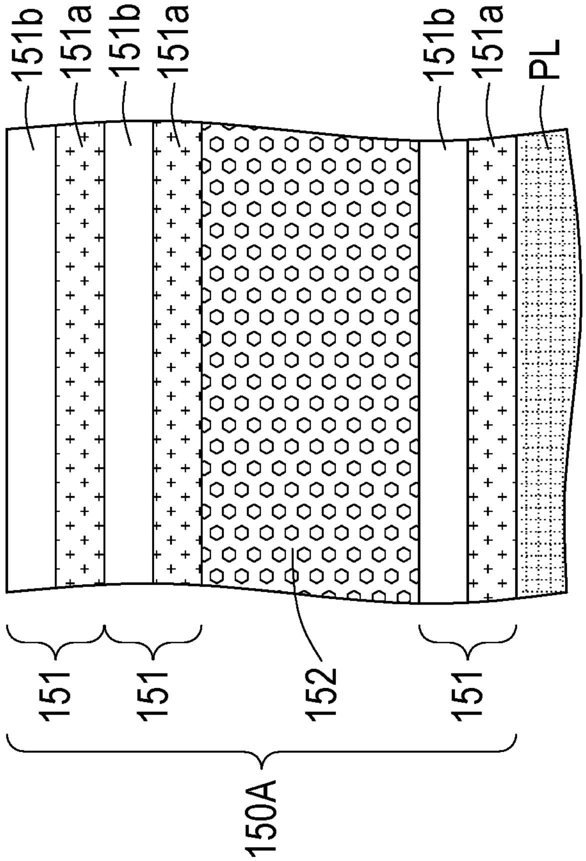
FIG. 3 is a schematic cross-sectional view of a composite layer structure according to another variant embodiment of FIG. 2A.

FIG. 1 is a schematic cross-sectional view of a display device using an encapsulation structure according to an embodiment of the disclosure. FIG. 2A and FIG. 2B are schematic cross-sectional views of a composite layer structureture of FIG. 1. FIG. 3 is a schematic cross-sectional view of a composite layer structure according to another variant embodiment of FIG. 2A.

Referring to FIG. 1, an encapsulation structure 50 adapted to a display device 10 includes a substrate 100 and an isolation structure layer 120. The isolation structure layer 120 is disposed on the substrate 100 and defines multiple sub-pixel areas of the display device 10, such as a sub-pixel area SPA1, a sub-pixel area SPA2, and a sub-pixel area SPA3. For example, in this embodiment, the sub-pixel area SPA1, the sub-pixel area SPA2, and the sub-pixel area SPA3 may be used to display red, green, and blue respectively and constitute a display pixel area of the display device 10, but not limited thereto.

It should be noted that in this embodiment, although the number of the sub-pixel areas in FIG. 1 is exemplified as three, the number of the sub-pixel areas may be adjusted according to actual needs, and the disclosure is not limited by the content of the drawings.

More specifically, the isolation structure layer 120 has multiple openings defining multiple sub-pixel areas, such as an opening OPa defining the sub-pixel area SPA1 and two openings OPb defining the sub-pixel area SPA2 and the sub-pixel area SPA3. In this embodiment, a wavelength conversion pattern WCP and an optical pattern OTP are respectively disposed in the opening OPa and the opening OPb of the isolation structure layer 120. That is, the sub-pixel area SPA1 is provided with the wavelength conversion pattern WCP, and the sub-pixel area SPA2 and the sub-pixel area SPA3 are provided with an optical pattern OTP, respectively.

In another variant embodiment, a structural surface 120*s* of the isolation structure layer 120 is also optionally provided with a light-absorbing pattern layer to prevent light from any sub-pixel area from passing through other sub-pixel areas and affecting the quality of the displayed images.

In this embodiment, the substrate 100 is, for example, a pixel array substrate, and may include a signal wiring (such as a scanning line and a data line) and a pixel structure (such as a switching element and a capacitor), but is not limited thereto. A substrate surface 100*s* of the pixel array substrate is also provided with multiple micro light-emitting diodes. The micro-light-emitting diodes are located in the sub-pixel areas, respectively. That is, a correspondence relationship between the micro light-emitting diodes and the sub-pixel areas in this embodiment is one-to-one, but is not limited thereto. For example, the sub-pixel area SPA1 and the sub-pixel area SPA3 each have a micro light-emitting diode LED1, and the sub-pixel area SPA2 has a micro light-emitting diode LED2. In this embodiment, a light-emitting color of the micro light-emitting diode LED1 is, for example, blue, and a light-emitting color of the micro light-emitting diode LED2 is, for example, green.

On the other hand, a reflective layer RFL may be disposed on the substrate surface 100*s* of the pixel array substrate. The reflective layer RFL may be disposed between multiple micro-light emitting diodes. In order to enhance luminous efficiency of the micro light-emitting diodes, the reflective layer RFL and the isolation structure layer 120 may be made of photoresist materials doped with aluminum, silver, or titanium dioxide particles, but not limited thereto.

Specifically, the wavelength conversion pattern WCP may convert blue light emitted by the micro light-emitting diode LED1 also located in the sub-pixel area SPA1 into red light. The optical pattern OTP located in the sub-pixel area SPA2 is adapted to allow green light emitted by the micro light-emitting diode LED2 also located in the sub-pixel area SPA2 to directly pass through. The optical pattern OTP located in the sub-pixel area SPA3 is adapted to allow the blue light emitted by the micro light-emitting diode LED1 also located in the sub-pixel area SPA3 to directly pass through. However, the disclosure is not limited thereto. In other embodiments, the respective quantities of the wavelength conversion pattern WCP and the optical pattern OTP may be adjusted depending on the type of light-emitting color of the selected micro light-emitting diode.

For example, in this embodiment, a thickness 120*t* of the isolation structure layer 120 along the normal direction of the structural surface 120*s* facing away from the substrate 100 may be greater than or equal to 20 μm to meet the high film thickness requirements of the wavelength conversion pattern WCP, but is not limited thereto. From another viewpoint, in the normal direction of the substrate surface 100*s*, the structure surface 120*s* of the isolation structure layer 120 has a first height h1 with respect to the substrate surface 100*s*, the micro-light-emitting diode has a second height h2, and a ratio of the first height h1 to the second height h2 may be greater than 2.

Furthermore, the encapsulation structure 50 further includes a planarization layer PL disposed on the substrate 100 and having a peripheral portion PLp surrounding and covering the isolation structure layer 120. More specifically, the peripheral portion PLp of the planarization layer PL does not overlap with multiple sub-pixel areas SPA1 to SPA3 in the normal direction of the substrate surface 100*s*. It should be noted that a thickness t of the peripheral portion PLp of the planarization layer PL in the normal direction of the substrate surface 100*s* increases as it approaches the isolation structure layer 120.

In detail, the peripheral portion PLp of the planarization layer PL has a peripheral surface PLps facing away from the substrate 100 and an edge PLe connected to the substrate 100. For example, an angle θ between a virtual line VL between any point on the peripheral surface PLps of the peripheral portion PLp and any point on the edge PLe of the peripheral portion PLp and the substrate surface 100*s* of the substrate 100 is greater than 0 degrees and less than or equal to 45 degrees. That is to say, the thickness t of the peripheral portion PLp of the planarization layer PL increases in a relatively gentle manner from the edge PLe toward the isolation structure layer 120.

In this embodiment, the planarization layer PL further has a planarization portion PLf extending from the peripheral portion PLp, and the planarization portion PLf covers the structural surface 120*s*, the wavelength conversion pattern WCP, and the optical pattern OTP of the isolation structure layer 120 facing away from the substrate 100. However, the disclosure is not limited thereto. In other embodiments, the planarization layer may not have the planarization portion PLf, and the connection between the peripheral portion PLp and the isolation structure layer 120 may be aligned with the structural surface 120*s* of the isolation structure layer 120. A material of the planarization layer PL includes, for example, acrylic acid with a water content of less than 30 ppm.

The encapsulation structure 50 further includes a composite layer structure 150 covering the planarization layer PL and the isolation structure layer 120. It should be particularly noted that an edge of the composite layer structure 150 is connected to the substrate 100 and extends from the substrate surface 100*s* of the substrate 100 to cover the peripheral portion PLp and the planarization portion PLf of the planarization layer PL.

As the slope change of the peripheral surface PLps of the planarization layer PL is relatively gentle, and the connection between the peripheral surface PLps and the planarization portion PLf is also relatively gentle, the composite layer structure 150 may be prevented from film breakage due to the structural topography of the isolation structure layer 120 being too steep. In other words, the integrity of the film surface of the composite layer structure 150 may be ensured to prevent encapsulation failure.

In this embodiment, ductility and malleability of the planarization layer PL may be greater than ductility and malleability of the composite layer structure 150 to further reduce the internal stress of the composite layer structure 150 due to changes in the topography of the isolation structure layer 120, so as to prevent the occurrence of film breakage of the composite layer structure 150.

Furthermore, the composite layer structure 150 at least includes two barrier layers 151 and an extension layers 152. The extension layer 152 is between the two barrier layers 151 and connects the two barrier layers 151. It should be noted that a water vapor transmission rate (WVTR) and ductility and malleability of the extension layer 152 are respectively greater than a water vapor transmission rate and ductility and malleability of the barrier layer 151. Since the extension layer 152 is separated from the planarization layer PL by a barrier layer 151, and the barrier layer 151 is further connected to the substrate surface 100*s*, the extension layer 152 does not directly contact the planarization layer PL. Even if water vapor infiltrates into the extension layer 152 of the composite layer structure 150, it is not easy to further infiltrate into the planarization layer PL through the barrier layer 151, which may significantly enhance the water and oxygen barrier capability of the composite layer structure 150.

A material of the composite layer structure 150 may be silicone resin, and the silicone resin includes, for example, organosilicon resin (OSR), silane hydrocarbon silicone resin (SHS), silicone rubber (SRR), polydimethylsiloxane (PDMS), methyl silicone resin (MSR), fatty acid-based silicone resin (FAS), cured silicone resin (CSR), inorganic filler-reinforced silicone resin (IFSR), alumina-filled silicone resin (AFSR), siloxane hydrophobic silicone resin (SHSR).

Referring to FIG. 1, FIG. 2A, and FIG. 2B, the barrier layer 151 may include a first sub-layer 151*a* and a second sub-layer 151*b*, and a percentage of total atomic of carbon and hydrogen in the first sub-layer 151*a* is higher than a percentage of total atomic of carbon and hydrogen in the second sub-layer 151*b*. In this embodiment, the two first sub-layers 151*a* and the two second sub-layers 151*b* of the two barrier layers 151 are alternately stacked in a direction of stack of the two barrier layers 151. For example, a material of the first sub-layer 151*a* is, for example, SiOx (CH)y, and a material of the second sub-layer 151*b* is, for example, SiOx (CH), where y is much greater than 1. More specifically, the first sub-layer 151*a* may be an organic-like layer, and the second sub-layer 151*b* may be an inorganic-like layer.

Since the first sub-layer 151*a* has a higher percentage of total atomic of carbon and hydrogen, ductility and malleability thereof is better than that of the second sub-layer 151*b*. Thus, in this embodiment, one barrier layer 151 of the composite layer structure 150 that contacts the substrate 100 and the planarization layer PL contacts the substrate 100 with the first sub-layer 151*a* to prevent the second sub-layer 151*b* from depositing on the rigid substrate and breaking the film and affecting the water and oxygen barrier capability of the barrier layer 151.

On the other hand, since the ductility and malleability of the first sub-layer 151*a* is more similar to the ductility and malleability of the planarization layer PL than that of the second sub-layer 151*b*, the risk of the barrier layer 151 peeling off from the planarization layer PL may be substantially reduced. In other words, the adhesion of the barrier layer 151 to the planarization layer PL may be made more effective.

In this embodiment, the extension layer 152 of the composite layer structure 150, the first sub-layer 151*a* and the second sub-layer 151*b* of the barrier layer 151 have thicknesses t152, t151*a*, and t151*b* respectively in a direction of stack of the extension layer 152 and the barrier layer 151, and the thickness t152 of the extension layer 152 is greater than the thickness of the barrier layer 151 (i.e., a sum of the thickness t151*a* and the thickness t151*b*). For example, the thickness t152 of the extension layer 152 is 3 μm, and the thickness t151*a* of the first sub-layer 151*a* and the thickness t151*b* of the second sub-layer 151*b* of the barrier layer 151 are equal to each other and are respectively 150 nm, but are not limited thereto. In other embodiments, the thicknesses of the first sub-layer 151*a* and the second sub-layer 151*b* of the barrier layer 151 may be different.

For example, two barrier layers 151 with a total thickness of 600 nm may have a water vapor transmission rate (WVTR) less than or equal to $5\times10^{-4}$ g/(m$^2$·day).

Specifically, the disclosure does not limit the number of the barrier layer 151 in the composite layer structure 150. In another variant embodiment, the number of the barrier layers 151 in a composite layer structure 150A may also be three, one of the barrier layers 151 is located between the extension layer 152 and the planarization layer PL, and the other two barrier layers 151 are located on a side of the extension layer 152 facing away from the planarization layer PL. Multiple first sub-layers 151*a* and multiple second sub-layers 151*b* of the three barrier layers 151 are alternately stacked in the direction of stack of the extension layer 152 and the barrier layers 151 (as shown in FIG. 3).

Please continue to refer to FIG. 1. In this embodiment, the composite layer structure 150 may be provided with another substrate 200 on a side facing away from the substrate 100, and the substrate 200 is, for example, a color filter substrate. The color filter substrate 200 may be provided with a light-absorbing pattern layer 210 and multiple color filter patterns. The light-absorbing pattern layer 210 has multiple color filter patterns that overlap multiple sub-pixel areas, which may further filter the light from the wavelength conversion pattern WCP and the optical pattern OTP.

For example, in this embodiment, the sub-pixel area SPA1, the sub-pixel area SPA2, and the sub-pixel area SPA3 are respectively provided with a color filter pattern 231 adapted to allow the red light to pass through, a color filter pattern 232 adapted to allow the green light to pass through, and a color filter pattern 233 adapted to allow the blue light to pass through.

In this embodiment, the color filter substrate (i.e., the substrate 200) is adapted to be assembled to a pixel array substrate (i.e., the substrate 100) through an adhesive layer 250. That is, the adhesive layer 250 connects the composite layer structure 150 on the pixel array substrate and the light-absorbing pattern layer 210 and multiple color filter patterns on the color filter substrate.

From another viewpoint, since the adhesive layer 250 completely encases the composite layer structure 150 and the planarization layer PL, the adhesive layer 250 may also be regarded as a part of the encapsulation structure 50. A material of the adhesive layer 250 includes, for example, optical clear resin (OCR), but is not limited thereto.

In this embodiment, the encapsulation structure 50 may further include a sealing layer 270 disposed around the planarization layer PL, the composite layer structure 150, and the adhesive layer 250. For example, in this embodiment, after the substrate 200 covers the adhesive layer 250 to complete the assembly and is divided into multiple pixels using a photolithography process, for example, the adhesive layer 250 of each pixel on the pixel array substrate 100 may be made approximately aligned with a side of the substrate 200 by applying encapsulant. Thereby, the sealing layer 270 covers exposed side areas of the adhesive layer 250, part of the substrate surface 100*s*, and part of the substrate 200 to achieve a second sealing effect and delay the damage of water vapor intrusion to the wavelength conversion material. A material of the sealing layer 270 includes, for example, silane resin, but is not limited thereto.

Other embodiments will be listed below to illustrate the disclosure in detail, in which the same components will be marked with the same numeral references, and the description of the same technical content will be omitted. The omitted parts will be referred to the preceding embodiments, and will not be repeated in the following.

Figure 4:
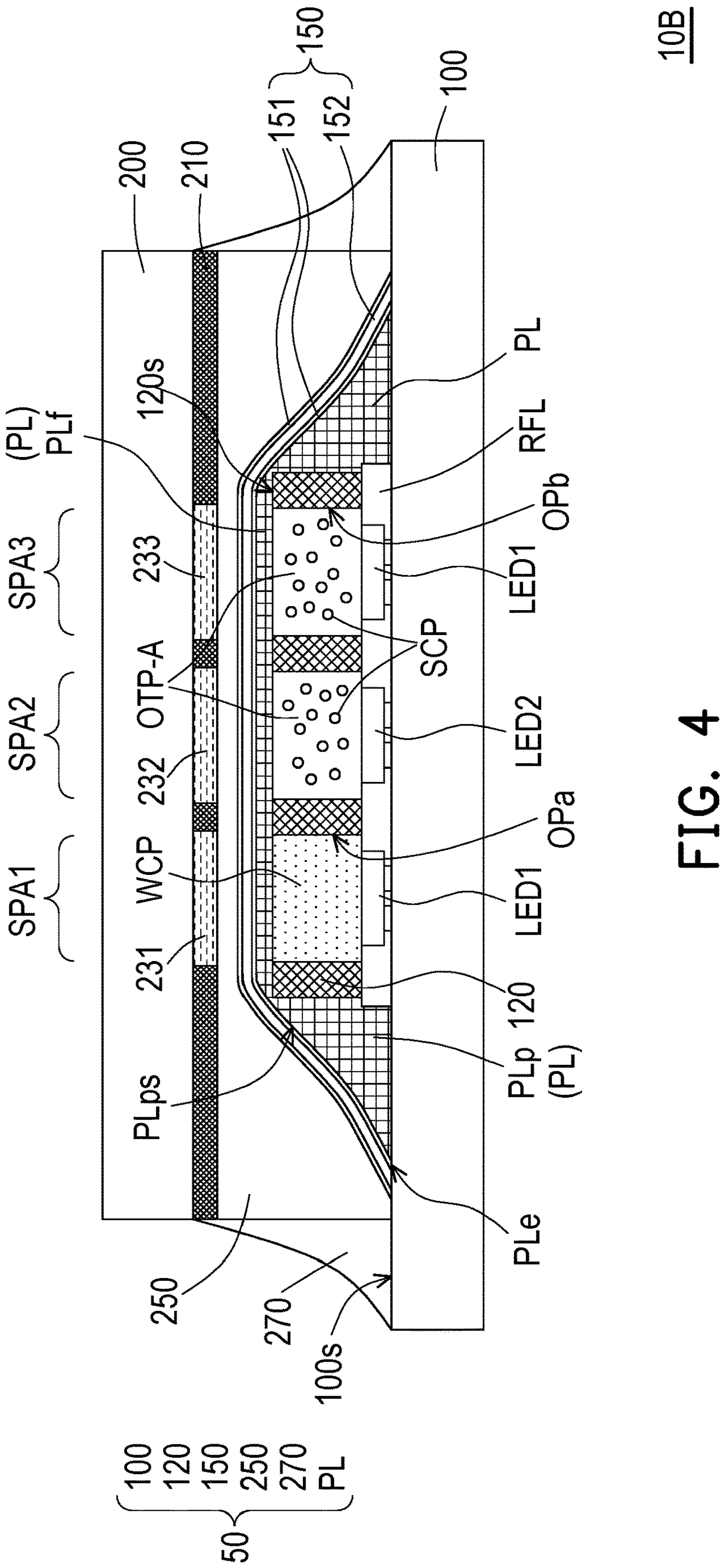
FIG. 4 is a schematic cross-sectional view of a display device according to another variant embodiment of FIG. 1.

FIG. 4 is a schematic cross-sectional view of a display device according to another variant embodiment of FIG. 1. Referring to FIG. 4, the only difference between a display device 10B of this embodiment and the display device 10 of FIG. 1 is that the composition of the optical pattern is different. In this embodiment, an optical pattern OTP-A filled in the opening OPb of the isolation structure layer 120 may include multiple scattering particles SCP, and the scattering particles SCP are dispersedly disposed in the light-transmitting resin of the optical pattern OTP-A. For example, a volume percentage of the scattering particles SCP in the optical pattern OTP-A is less than 10%, and their respective particle sizes are about 200 nm, but are not limited thereto.

As the optical pattern OTP-A of this embodiment is mixed with a certain proportion of scattering particles SCP, the difference between the light pattern distribution of the light emitted from the micro light-emitting diode LED2 after passing through the optical pattern OTP-A and the light pattern distribution of the light emitted from the micro light-emitting diode LED1 after being converted by the wavelength conversion pattern WCP may be effectively reduced, which is helpful to improve the display quality (e.g., color mixing effect) of the display device 10B.

Figure 5:
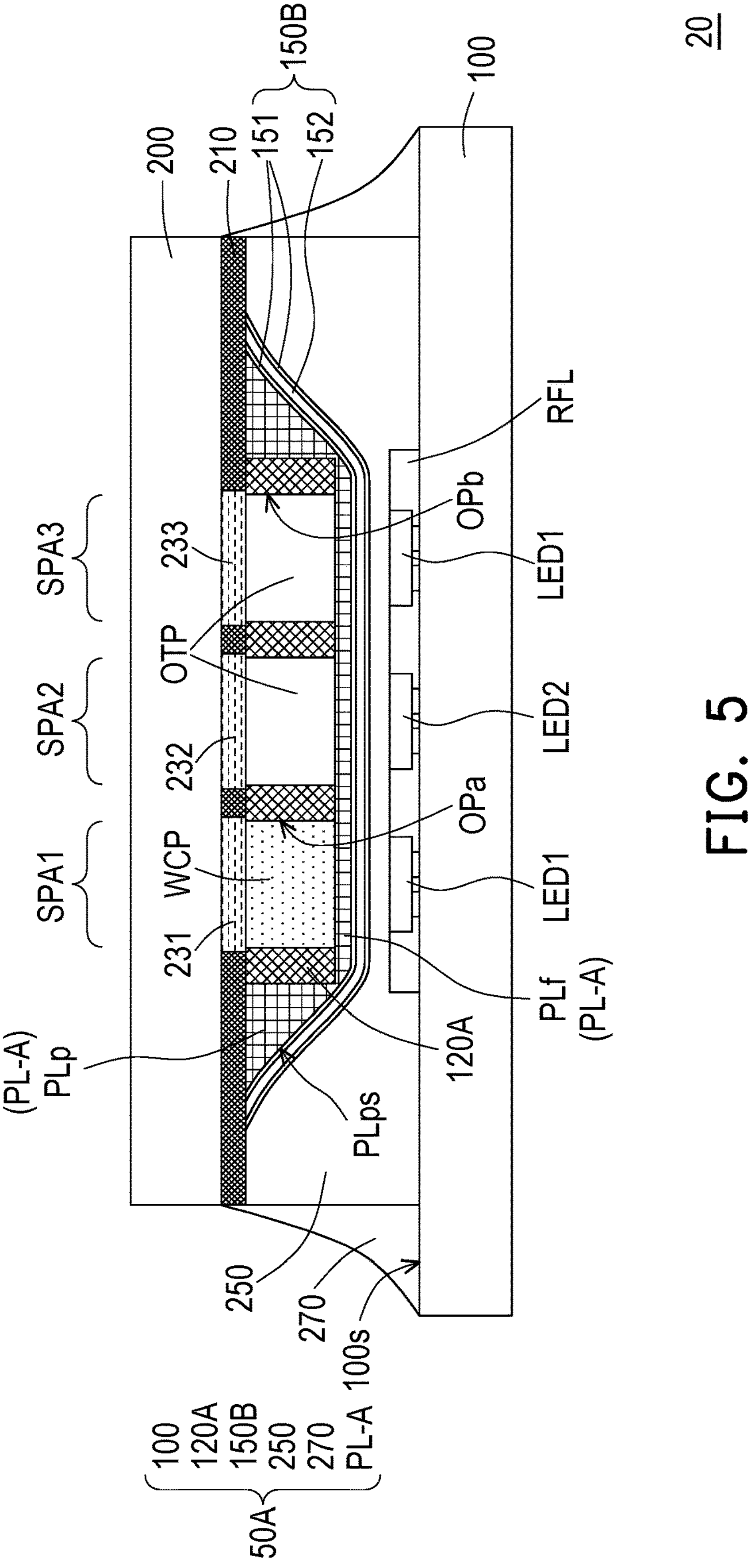
FIG. 5 is a schematic cross-sectional view of a display device using an encapsulation structure according to another embodiment of the disclosure.

FIG. 5 is a schematic cross-sectional view of a display device using an encapsulation structure according to another embodiment of the disclosure. Referring to FIG. 5, the only difference between a display device 20 of this embodiment and the display device 10 of FIG. 1 is that the placement position of the encapsulation structure is different. In the display device 20 of this embodiment, an encapsulation structure 50A is not disposed on the pixel array substrate (i.e., the substrate 100), but is disposed on the color filter substrate (i.e., the substrate 200).

Specifically, an isolation structure layer 120A, the wavelength conversion pattern WCP, and the optical pattern OTP of the display device 20 are all disposed on the substrate 200, for example, on the light-absorbing pattern layer 210 and the color filter patterns, but are not limited thereto. In other embodiments, the substrate 200 may also be a general glass cover plate without the light-absorbing pattern layer 210 and the color filter pattern.

In order to ensure that the wavelength conversion pattern WCP on the substrate 200 is not subject to failure due to water vapor intrusion, a planarization layer PL-A and a composite layer structure 150B of the encapsulation structure 50A are disposed on the substrate 200 in a configuration relationship similar to that between the planarization layer PL, the composite layer structure 150, and the isolation structure layer 120 in FIG. 1. Thus, please refer to the relevant paragraphs of the previous embodiments for detailed description, which will not be repeated in the following.

In this embodiment, the encapsulation structure 50A and the micro light-emitting diodes LED1 and LED2 are disposed on different substrates, so that the planarization layer PL-A and the composite layer structure 150B only need to cover the isolation structure layer 120A, and do not need to cover the micro light-emitting diodes LED1, LED2 together, whereby the planarization layer PL-A disposed on the substrate 200 may be further thinned compared to the planarization layer PL of FIG. 1, which helps to further reduce the risk of film breakage on the isolation structure layer 120A and the composite layer structure 150B.

In particular, although not shown in FIG. 5, in this embodiment, the reflective layer RFL between the micro light-emitting diodes may also be selectively provided with a light-blocking structure that exposes the micro light-emitting diodes. The light-blocking structure may be used to block the light emitted from the micro light-emitting diode at a large angle, thereby preventing light from any sub-pixel area from passing through other sub-pixel areas and affecting the quality of the displayed images.

On the other hand, placing the wavelength conversion pattern WCP on the substrate 200 (such as the color filter substrate or the glass cover plate) has many advantages, including, for example, preventing deterioration of the wavelength conversion pattern WCP due to the absorption of waste heat generated by the micro light-emitting diodes in direct contact with the micro light-emitting diodes, which would result in a reduction of the service life of the WCP. Moreover, the placement of the wavelength conversion pattern WCP on the substrate 200 increases the process flexibility of the wavelength conversion pattern WCP (i.e., it is not subject to the process limitations of the pixel array substrate). For example, the isolation structure layer, if poorly molded, can be recreated on a new substrate 200 with no loss of the pixel array substrate (i.e., the substrate 100) and the micro light-emitting diodes thereon. Concurrently, since the isolation structure layer is not directly molded on the micro light-emitting diode, the structural shape of the isolation structure layer or the debris generated during the manufacturing process will not directly obscure the surface of the micro light-emitting diode, which may reduce the possible impact on the light output efficiency. Furthermore, the separation of the isolation structure layer and the pixel array substrate makes it easier to perform electrical or optical inspection and repair of the isolation structure layer and the micro light emitting element separately, and the overall yield is easier to maintain.

To sum up, in the encapsulation structure of an embodiment of the disclosure, the planarization layer has the peripheral portion surrounding and covering the isolation structure layer, and closer to the isolation structure layer, the thickness of the peripheral portion increases. Thus, the composite layer structure connecting the substrate is less susceptible to film breakage and encapsulation failure in the area covering the planarization layer and the isolation structure layer. In addition, since the water vapor transmission rate of the barrier layer in the composite layer structure is smaller than the water vapor transmission rate of the extension layer, the barrier layer extending between the extension layer and the planarization layer and connecting the substrate may effectively prevent water vapor from infiltrating into the planarization layer and the isolation structure layer through the extension layer, thus enhancing the overall water and oxygen barrier capability of the composite layer structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An encapsulation structure, comprising:

a substrate;

an isolation structure layer, disposed on the substrate, defining a plurality of sub-pixel areas;

a planarization layer, disposed on the substrate, having a peripheral portion surrounding and covering the isolation structure layer, wherein a thickness of the peripheral portion increases closer to the isolation structure layer; and a composite layer structure, contacting the substrate and covering the planarization layer and the isolation structure layer, the composite layer structure comprising:

two barrier layers; and an extension layer, located between and connecting the two barrier layers, wherein a thickness, a water vapor transmission rate, and ductility and malleability of the extension layer are respectively greater than a thickness, a water vapor transmission rate, and ductility and malleability of each of the two barrier layers.

2. The encapsulation structure according to claim 1, wherein ductility and malleability of the planarization layer is greater than ductility and malleability of the composite layer structure.

3. The encapsulation structure according to claim 1, wherein the peripheral portion of the planarization layer has a peripheral surface facing away from the substrate and an edge contacting the substrate, and an angle between a virtual line between any point on the peripheral surface and any point on the edge and a substrate surface of the substrate is greater than 0 degrees and less than or equal to 45 degrees.

4. The encapsulation structure according to claim 1, wherein the each of the two barrier layers comprises:

a first sub-layer and a second sub-layer, wherein a percentage of total atoms of carbon and hydrogen in the first sub-layer is greater than a percentage of total atoms of carbon and hydrogen in the second sub-layer, and the two first sub-layers and the two second sublayers of the two barrier layers are stacked alternately in a direction of stack of the two barrier layers.

5. The encapsulation structure according to claim 4, wherein the first sub-layer of one of the two barrier layers that contacts the substrate contacts the substrate and the planarization layer.

6. The encapsulation structure according to claim 1, wherein the isolation structure layer has a plurality of openings defining the sub-pixel areas, and a plurality of wavelength conversion patterns are disposed in a part of the openings.

7. The encapsulation structure according to claim 6, wherein the planarization layer further has a planarization portion extending from the peripheral portion, and the planarization portion covers a structural surface of the isolation structure layer facing away from the substrate and the wavelength conversion patterns.

8. The encapsulation structure according to claim 6, wherein a plurality of optical patterns are disposed in another part of the openings, and each of the optical patterns comprises a plurality of scattering particles.

9. The encapsulation structure according to claim 1, wherein the substrate is a pixel array substrate, a plurality of micro light-emitting diodes are disposed on a substrate surface of the pixel array substrate, and the micro light-emitting diodes are located in the sub-pixel areas, respectively.

10. The encapsulation structure according to claim 1, adapted to be assembled to a pixel array substrate through an adhesive layer, wherein the adhesive layer connects the composite layer structure and the pixel array substrate, a plurality of micro light-emitting diodes are disposed on the pixel array substrate, and the micro light-emitting diodes are located in the sub-pixel areas, respectively.

11. The encapsulation structure according to claim 10, wherein the substrate is a color filter substrate, a plurality of color filter patterns are disposed on the color filter substrate, and the color filter patterns are located in the sub-pixel areas, respectively.

12. The encapsulation structure according to claim 1, further comprising:

a sealing layer, disposed around the planarization layer and the composite layer structure, wherein the composite layer structure is provided with another substrate and an adhesive layer on a side facing away from the substrate, the adhesive layer connects the another substrate, the composite layer structure, and the sealing layer, and encases the composite layer structure and the planarization layer.

* * * * *